United States Patent
Cho et al.

(10) Patent No.: US 11,837,537 B2
(45) Date of Patent: Dec. 5, 2023

(54) FAN-OUT SEMICONDUCTOR PACKAGE

(71) Applicant: SAMSUNG ELECTRONICS CO., LTD., Suwon-si (KR)

(72) Inventors: Bongju Cho, Suwon-si (KR); Myungsam Kang, Suwon-si (KR); Younggwan Ko, Suwon-si (KR); Gun Lee, Suwon-si (KR); Jaekul Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 29 days.

(21) Appl. No.: 17/403,233

(22) Filed: Aug. 16, 2021

(65) Prior Publication Data

US 2021/0375757 A1 Dec. 2, 2021

Related U.S. Application Data

(63) Continuation of application No. 16/588,269, filed on Sep. 30, 2019, now Pat. No. 11,121,079.

(30) Foreign Application Priority Data

Nov. 20, 2018 (KR) .......................... 10-2018-0143626

(51) Int. Cl.
*H01L 23/522* (2006.01)
*H01L 23/31* (2006.01)
(Continued)

(52) U.S. Cl.
CPC ...... *H01L 23/5226* (2013.01); *H01L 23/3157* (2013.01); *H01L 23/49531* (2013.01);
(Continued)

(58) Field of Classification Search
CPC ............. H01L 23/5226; H01L 23/3157; H01L 23/49531; H01L 23/49534; H01L 23/5283;
(Continued)

(56) References Cited

U.S. PATENT DOCUMENTS 10,325,891 B1 6/2019 Lim et al.
11,158,576 B2 * 10/2021 Chang ................. H01L 23/3185
(Continued)

FOREIGN PATENT DOCUMENTS

CN 106684048 A 5/2017
JP 2000-100820 A 4/2000
(Continued)

OTHER PUBLICATIONS

Communication dated Jul. 28, 2023 issued from the Chinese Patent Office in CN Patent Application No. 201911132469.X.

*Primary Examiner* — Victor A Mandala
(74) *Attorney, Agent, or Firm* — Sughrue Mion, PLLC

(57) ABSTRACT

A fan-out semiconductor package includes a first connection structure having first and second surfaces, a first semiconductor chip disposed on the first surface, a first encapsulant disposed on the first surface and covering at least a portion of the first semiconductor chip, a second semiconductor chip disposed on the second surface, one or more first metal members disposed on the second surface, one or more second metal members disposed on the second surface, a second encapsulant disposed on the second surface and respectively covering at least portions of the second semiconductor chip and the first and second metal members, and a second connection structure disposed on an opposite side of a side of the second encapsulant, on which the first connection structure is disposed.

20 Claims, 18 Drawing Sheets

(51) Int. Cl.
*H01L 23/495* (2006.01)
*H01L 23/528* (2006.01)
*H01L 23/00* (2006.01)

(52) U.S. Cl.
CPC .... *H01L 23/49534* (2013.01); *H01L 23/5283* (2013.01); *H01L 24/09* (2013.01); *H01L 2224/02372* (2013.01); *H01L 2224/02377* (2013.01); *H01L 2224/02379* (2013.01); *H01L 2924/3511* (2013.01)

(58) Field of Classification Search
CPC ........... H01L 24/09; H01L 2224/02372; H01L 2924/3511; H01L 2224/02377; H01L 2224/02379; H01L 23/3128; H01L 21/568; H01L 23/562; H01L 23/16; H01L 2224/97; H01L 24/20; H01L 24/19; H01L 2224/96; H01L 2224/73267; H01L 2224/32225; H01L 2224/92244; H01L 2224/04105; H01L 2224/12105; H01L 23/5384; H01L 23/49811; H01L 23/13; H01L 23/36; H01L 23/49816; H01L 23/5389; H01L 23/528; H01L 24/02; H01L 23/3107; H01L 2224/023; H01L 2224/02331; H01L 2224/02373; H01L 23/043; H01L 23/3135; H01L 23/485; H01L 23/525; H01L 24/06; H01L 25/0657; H01L 2224/83
See application file for complete search history.

(56) References Cited

U.S. PATENT DOCUMENTS

| | | | |
|---|---|---|---|
| 11,450,560 B2* | 9/2022 | Bharath | H01L 23/13 |
| 11,527,486 B2* | 12/2022 | Wang | H01L 23/552 |
| 2010/0006330 A1 | 1/2010 | Fu et al. | |
| 2014/0103488 A1* | 4/2014 | Chen | H01L 24/19 257/532 |
| 2016/0276307 A1* | 9/2016 | Lin | H01L 23/562 |
| 2016/0307872 A1* | 10/2016 | Chen | H01L 21/4857 |
| 2016/0336296 A1 | 11/2016 | Jeong et al. | |
| 2017/0133351 A1* | 5/2017 | Su | H01L 23/5389 |
| 2017/0271248 A1* | 9/2017 | Chen | H01L 23/5389 |
| 2018/0047673 A1* | 2/2018 | Gu | H01L 23/481 |
| 2018/0082933 A1 | 3/2018 | Ko et al. | |
| 2018/0190591 A1 | 7/2018 | Kim et al. | |
| 2019/0035756 A1* | 1/2019 | Min | H01L 24/20 |
| 2019/0067039 A1* | 2/2019 | Wu | H01L 23/5389 |
| 2019/0067247 A1* | 2/2019 | Yoo | H01L 25/0657 |
| 2019/0139920 A1* | 5/2019 | Lee | H01L 25/0655 |
| 2021/0020679 A1* | 1/2021 | Kim | H01L 23/5286 |
| 2021/0257350 A1* | 8/2021 | Hu | H01L 21/6835 |
| 2021/0257717 A1* | 8/2021 | Chiang | G06V 40/1306 |
| 2022/0149014 A1* | 5/2022 | Yoo | H01L 21/6835 |
| 2022/0246590 A1* | 8/2022 | Yu | H01L 21/4853 |
| 2023/0074157 A1* | 3/2023 | Clark | H01L 21/563 |

FOREIGN PATENT DOCUMENTS

| | | |
|---|---|---|
| JP | 2016-219798 A | 12/2016 |
| KR | 10-2018-0080071 A | 7/2018 |
| KR | 10-1912292 B1 | 10/2018 |
| TW | 201814857 A | 4/2018 |

* cited by examiner

FAN-OUT SEMICONDUCTOR PACKAGE

CROSS-REFERENCE TO RELATED APPLICATION(S)

This application is a continuation of U.S. patent application Ser. No. 16/588,269, filed on Sep. 30, 2019, which claims the benefit under 35 USC 119(a) of Korean Patent Application No. 10-2018-0143626, filed on Nov. 20, 2018, in the Korean Intellectual Property Office, the entire disclosures of which are incorporated herein by reference for all purposes.

BACKGROUND

The present disclosure relates to a semiconductor package, and more particularly, to a fan-out semiconductor package.

A principal trend in the technical development of semiconductor chips has been reducing the size of components. Thus, in the field of packaging, a plurality of fins have been required to be implemented, while being miniaturized, according to a rapid increase in demand for small-sized semiconductor chips and the like.

To meet such demand, a fan-out semiconductor package has been proposed as a packaging technology. In the case of such a fan-out semiconductor package, an electrical connection metal such as solder balls or the like may also be redistributed, in addition to a region in which a semiconductor chip is disposed, such that a plurality of fins may be implemented while being miniaturized.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide a fan-out semiconductor package, which may be miniaturized and improved in performance, even when a plurality of semiconductor chips are used, and in which warpage may be improved.

One of various solutions proposed in the present disclosure is to package a plurality of semiconductor chips by disposing the semiconductor chips on respective upper and lower sides of a connection structure. In this case, a metal member for connection between upper and lower signals and a metal member for control of warpage are introduced around lower semiconductor chips.

An aspect of the present disclosure, a fan-out semiconductor package includes a first connection structure including a first redistribution layer containing a first signal pattern, the first connection structure having a first surface and a second surface opposing each other; a first semiconductor chip disposed on the first surface of the first connection structure, the first semiconductor chip having a first active surface on which a first connection pad is disposed and a first inactive surface opposing the first active surface; a first encapsulant disposed on the first surface of the first connection structure and covering at least a portion of the first semiconductor chip; a second semiconductor chip disposed on the second surface of the first connection structure, the second semiconductor chip having a second active surface on which a second connection pad is disposed and a second inactive surface opposing the second active surface; one or more first metal members disposed on the second surface of the first connection structure and electrically connected to the first signal pattern; one or more second metal members disposed on the second surface of the first connection structure and electrically insulated from the first signal pattern; a second encapsulant disposed on the second surface of the first connection structure and respectively covering at least portions of the second semiconductor chip and the first and second metal members; and a second connection structure disposed on an opposite side of a side of the second encapsulant, on which the first connection structure is disposed, the second connection structure including a second redistribution layer having a second signal pattern. The first and second connection pads are electrically connected to each other through the first and second signal patterns of the first and second redistribution layers, respectively, and the first metal member.

An aspect of the present disclosure, a fan-out semiconductor package includes a first connection structure including a first redistribution layer, and having a first surface and a second surface opposing each other; a first semiconductor chip disposed on the first surface of the first connection structure; a first encapsulant disposed on the first surface of the first connection structure and covering at least a portion of the first semiconductor chip; a second semiconductor chip disposed on the second surface of the first connection structure; a plurality of first metal members disposed on the second surface of the first connection structure and electrically connected to the first redistribution layer; a plurality of second metal members disposed on the second surface of the first connection structure and electrically insulated from the first redistribution layer; a second encapsulant disposed on the second surface of the first connection structure and respectively covering at least portions of the second semiconductor chip and the first and second metal members; and a second connection structure disposed on an opposite side of a side of the second encapsulant, on which the first connection structure is disposed, the second connection structure including a second redistribution layer. The first and second semiconductor chips are electrically connected to each other through the first and second redistribution layers and the plurality of first metal members, and the number of the plurality of second metal members is greater than the number of the plurality of first metal members.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
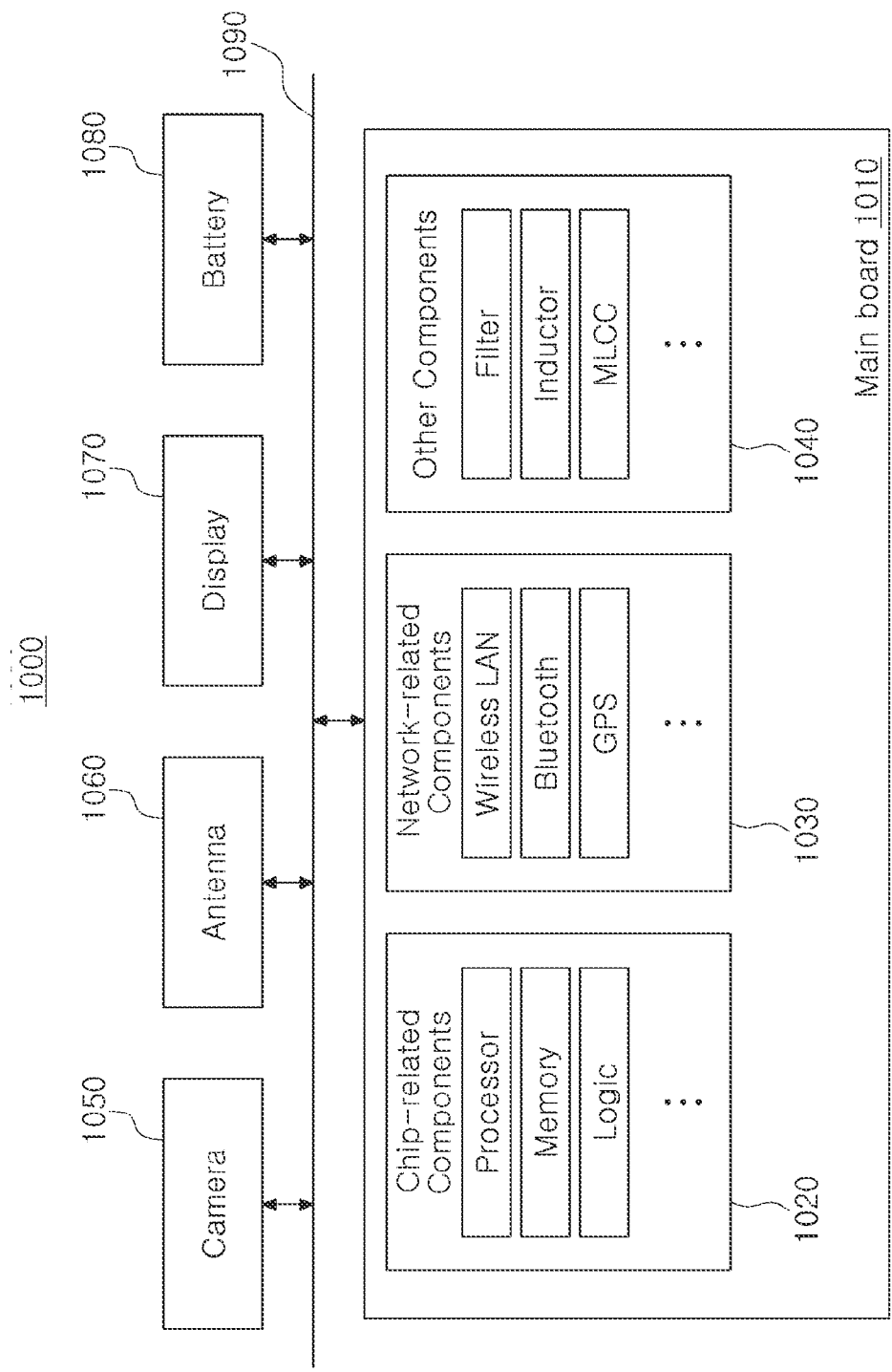
FIG. 1 is a schematic block diagram illustrating an example of an electronic device system.

Hereinafter, examples of the present disclosure will be described with reference to the accompanying drawings. The shape and size of constituent elements in the drawings may be exaggerated or reduced for clarity.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
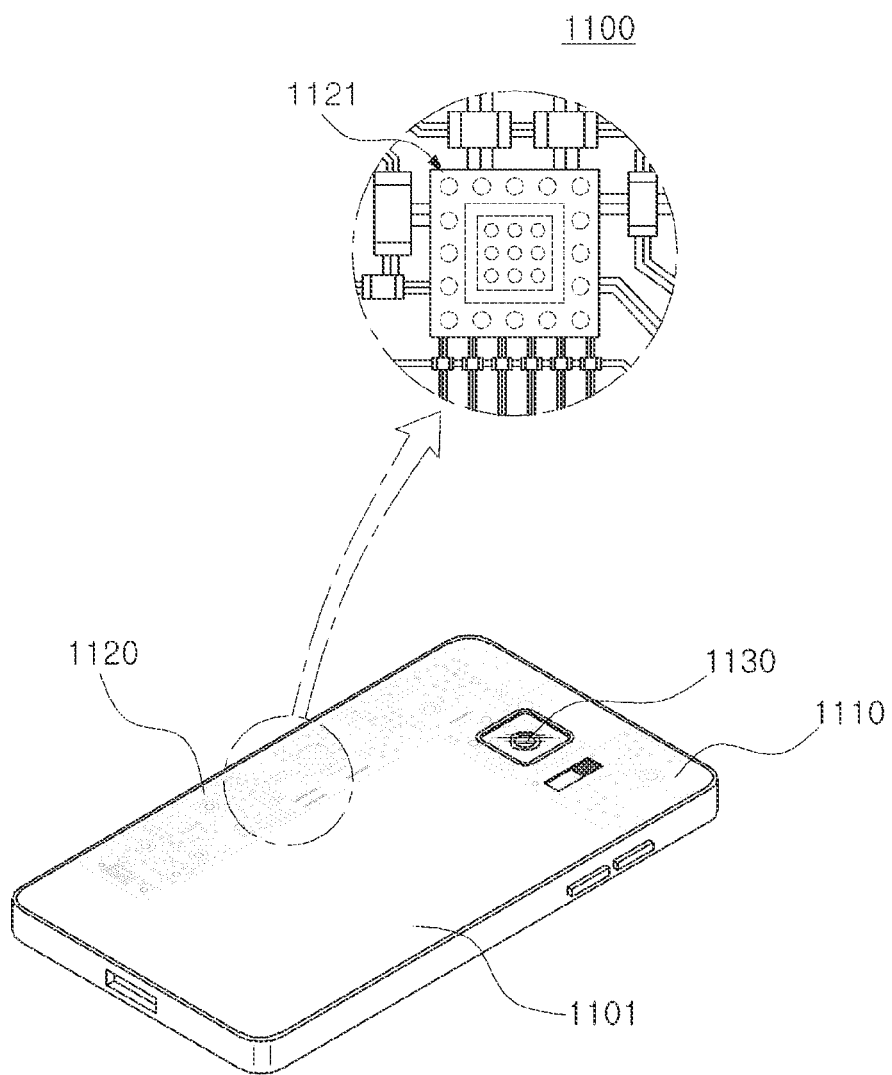
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

In this case, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3A:
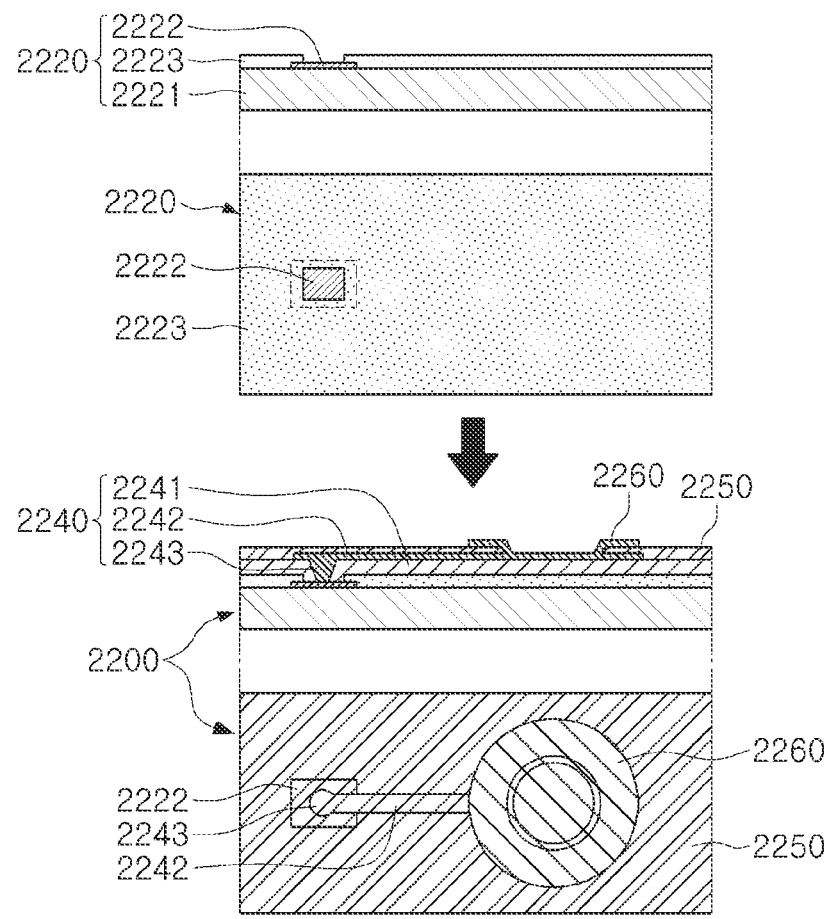
FIGS. 3A and 3B are schematic cross-sectional views illustrating states of a fan-in semiconductor package before and after being packaged.
Figure 3B:
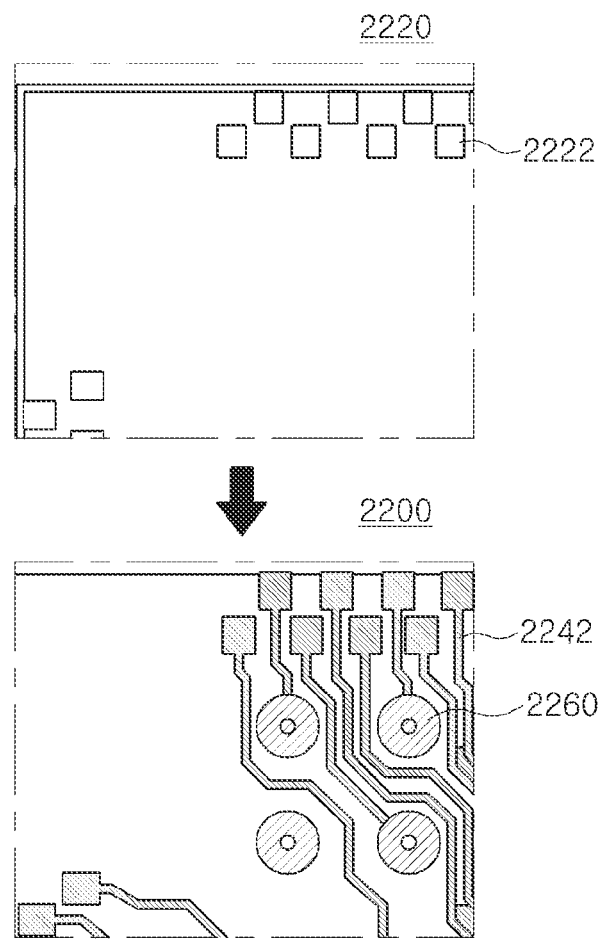

FIGS. 3A and 3B are schematic cross-sectional views illustrating states of a fan-in semiconductor package before and after being packaged.

Figure 4:
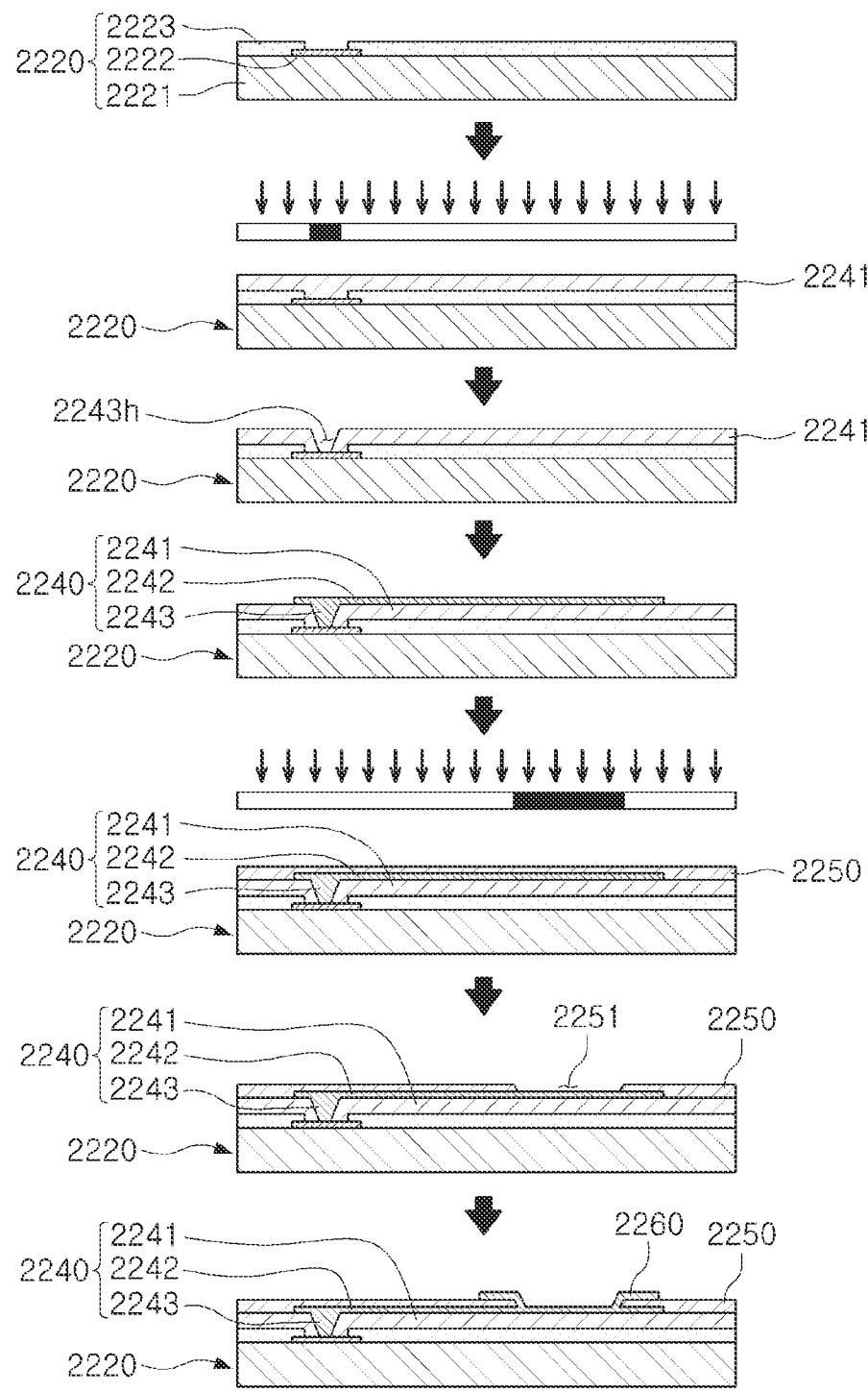
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 to redistribute the connection pads 2222. The connection member 2240 may be formed by forming an insulating layer 2241 on the semiconductor chip 2220 using an insulating material such as a photoimageable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
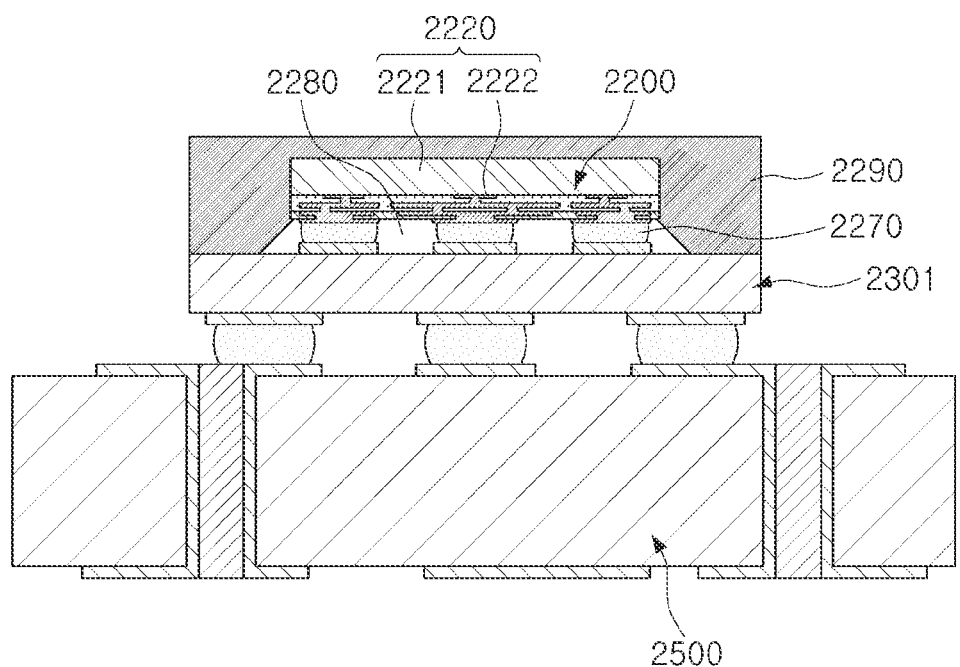
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
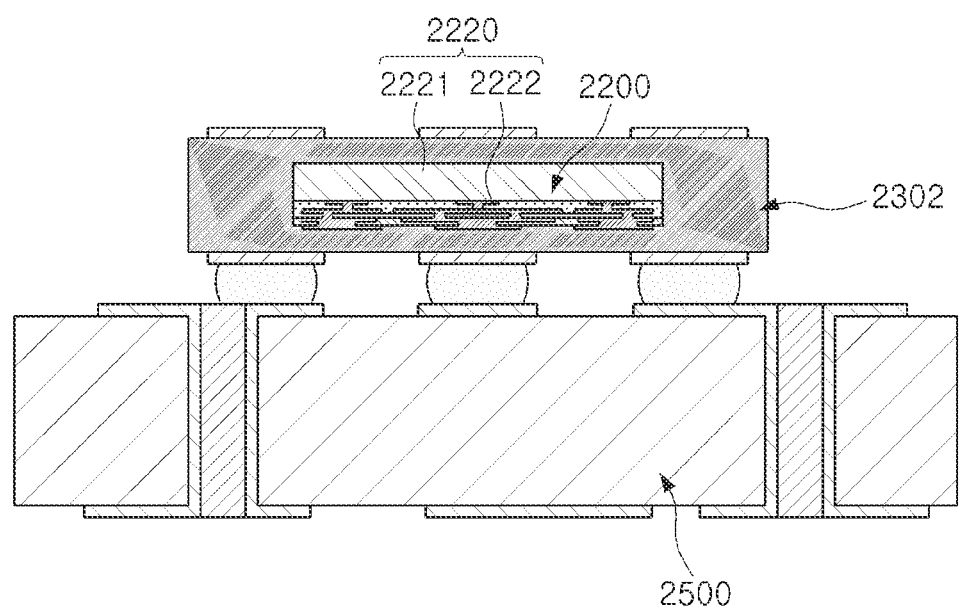
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a printed circuit board (PCB) and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be ultimately mounted on a mainboard 2500 of an electronic device in a state in which it is mounted on the PCB 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate PCB 2302, connection pads 2222, that is, I/O terminals, of the semiconductor chip 2220 may be redistributed by the PCB 2302 in a state in which the fan-in semiconductor package 2200 is embedded in the PCB 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate PCB and be then mounted on the mainboard of the electronic device through a packaging process or may be mounted and used on the mainboard of the electronic device in a state in which it is embedded in the PCB.

Fan-Out Semiconductor Package

Figure 7:
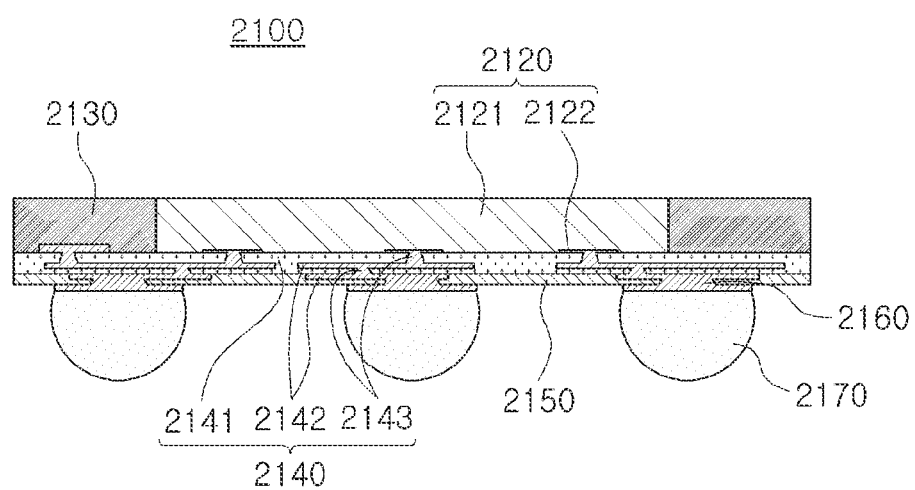
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate PCB, as described below.

Figure 8:
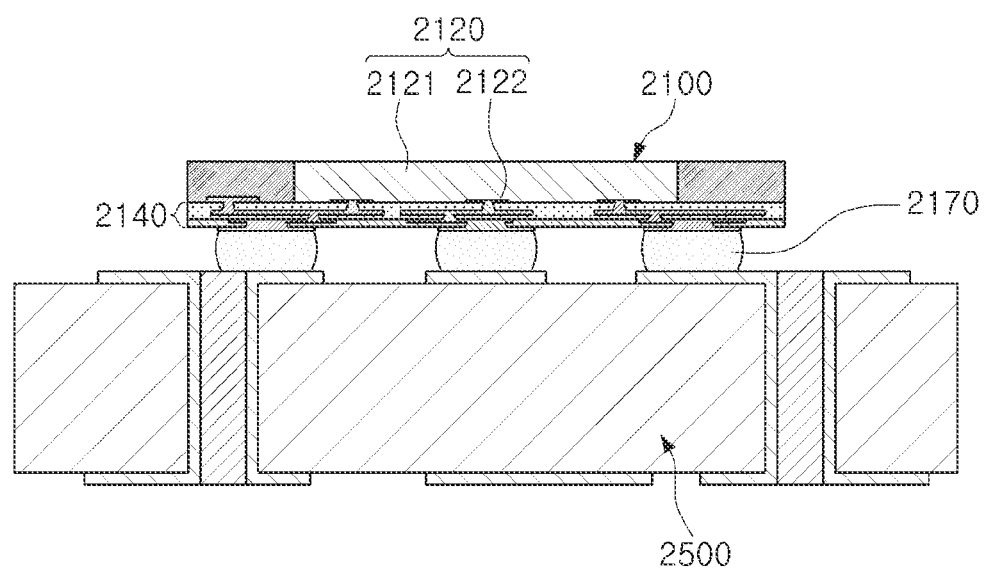
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate PCB, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a PCB, or the like, having a scale, a purpose, and the like, different from those of the fan-out semiconductor package, and having the fan-in semiconductor package embedded therein.

Hereinafter, a fan-out semiconductor package, in which thinning and high performance may be implemented even when a plurality of semiconductor chips are used, and in which warpage may also be reduced, will be described with reference to the accompanying drawings.

Figure 9:
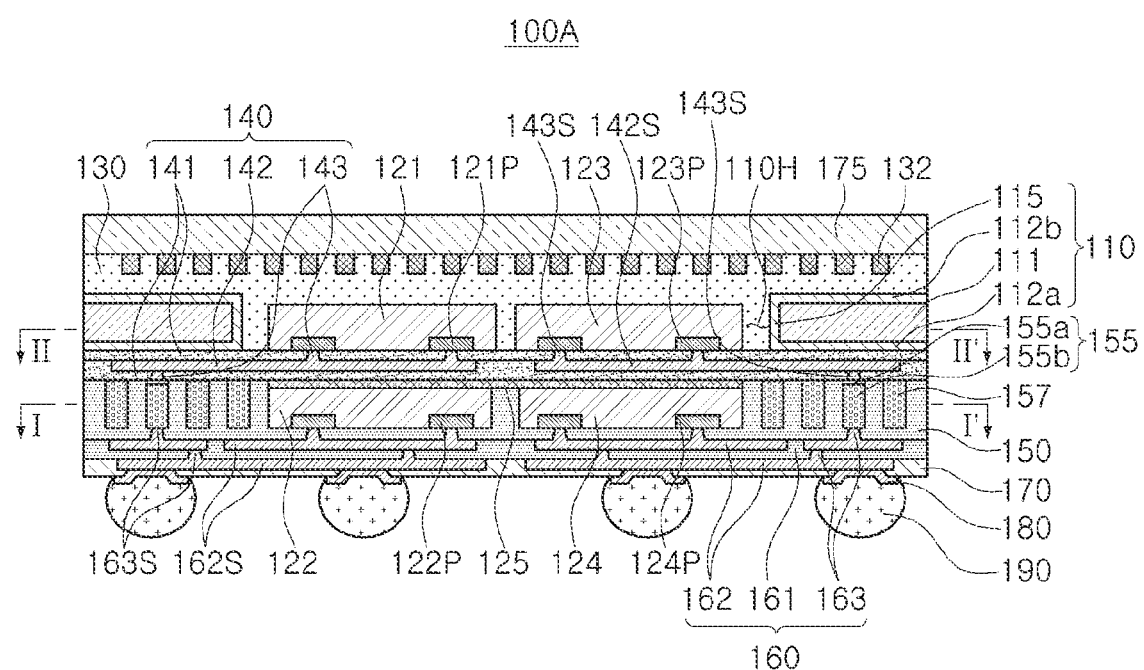
FIG. 9 is a schematic cross-sectional view illustrating an example of a fan-out semiconductor package.

FIG. 9 is a schematic cross-sectional view illustrating an example of a fan-out semiconductor package.

Figure 10:
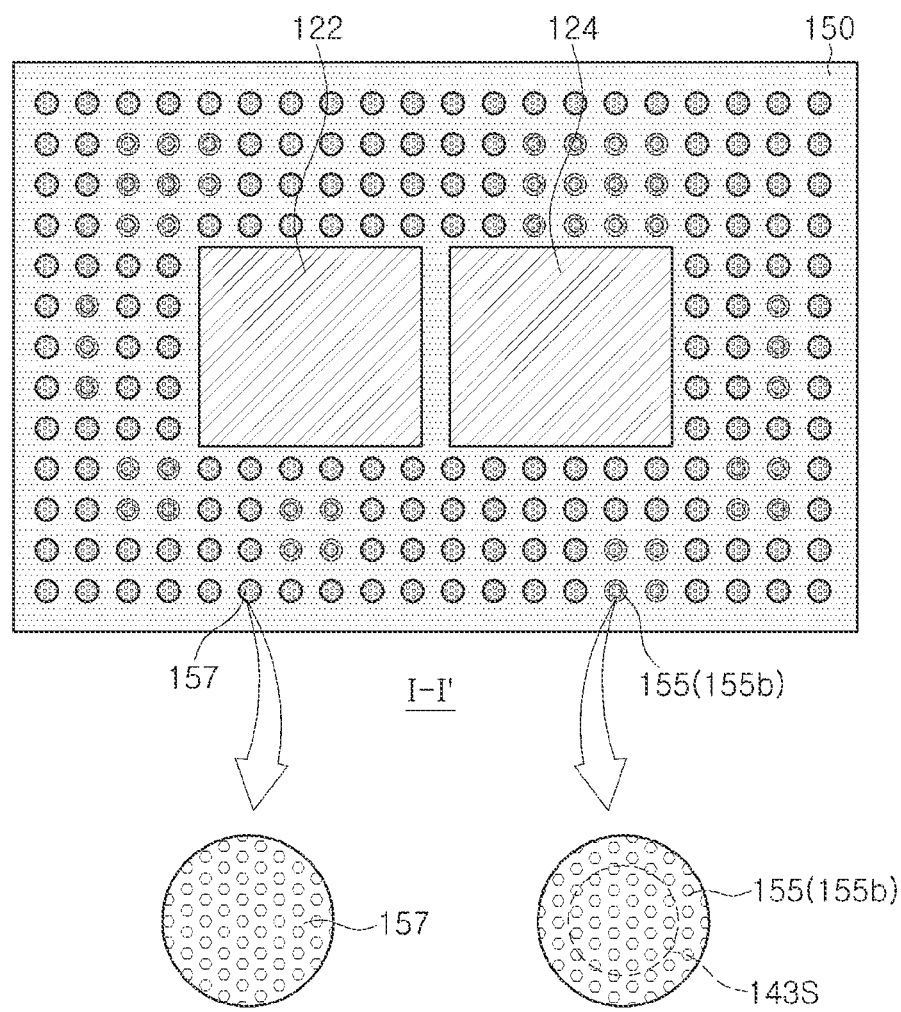
FIG. 10 is a schematic cutaway plan view of the fan-out semiconductor package, taken along line I-I' of FIG. 9.

FIG. 10 is a schematic cutaway plan view of the fan-out semiconductor package, taken along line I-I' of FIG. 9.

Figure 11:
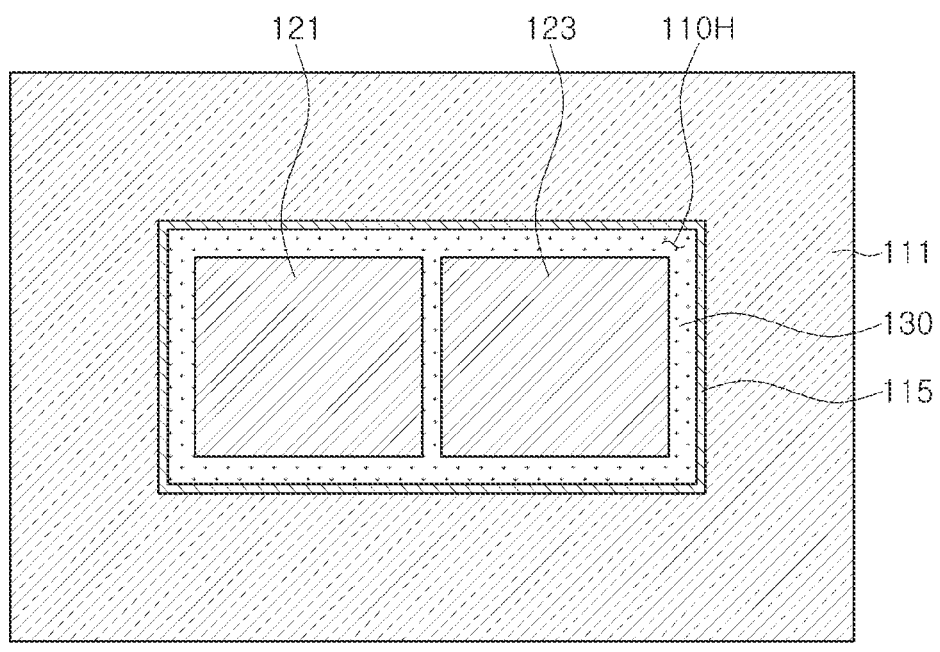
FIG. 11 is a schematic cutaway plan view of the fan-out semiconductor package, taken along line II-II' of FIG. 9.

FIG. 11 is a schematic cutaway plan view of the fan-out semiconductor package, taken along line II-II' of FIG. 9.

Figure 16:
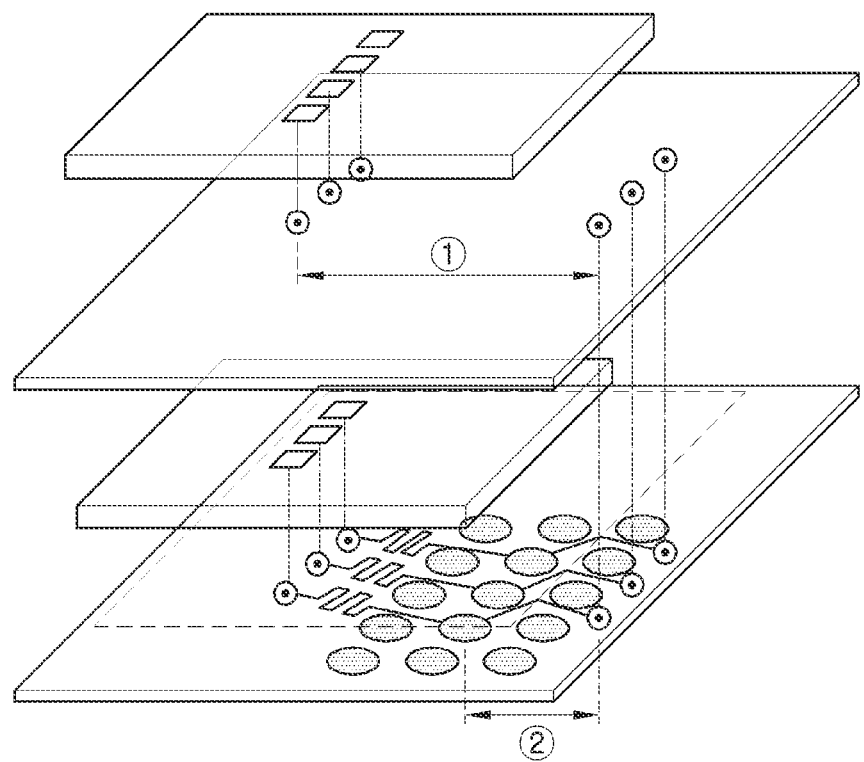
FIG. 16 schematically illustrates the effect of a fan-out semiconductor package according to an example.

FIG. 16 schematically illustrates the effect of a fan-out semiconductor package according to an example.

Figure 17:
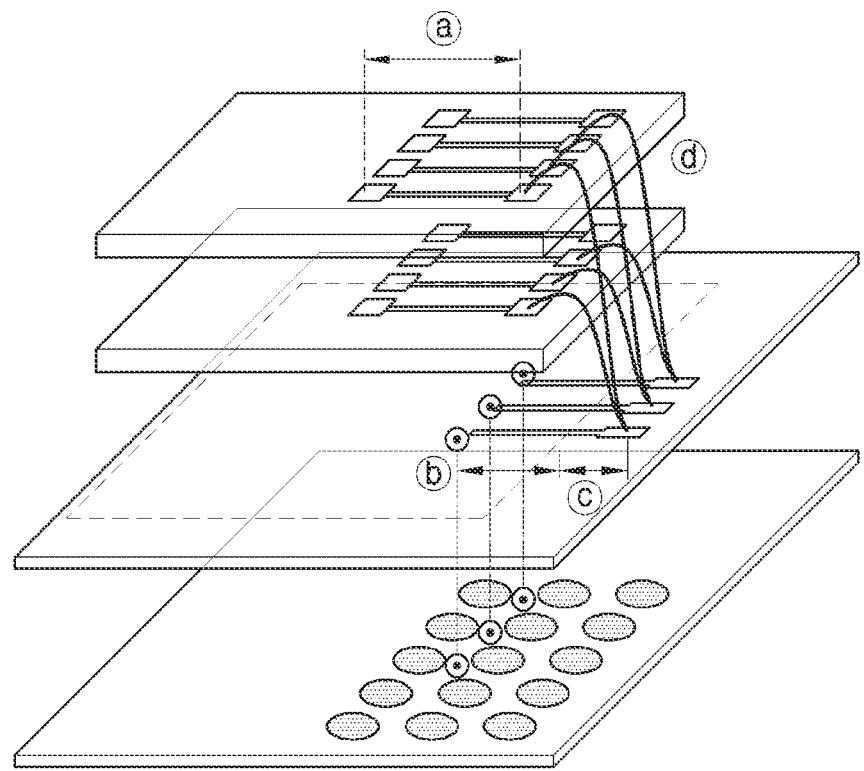
FIG. 17 schematically illustrates the problem of a fan-out semiconductor package according to the related art.

FIG. 17 schematically illustrates the problem of a fan-out semiconductor package according to the related art.

Referring to the drawings, a fan-out semiconductor package 100A according to an example includes a first connection structure 140, which includes a first redistribution layer 142 containing a first signal pattern 142S and has a first surface and a second surface opposing each other, a first semiconductor chip 121 disposed on the first surface of the first connection structure 140, the first semiconductor chip 121 having a first active surface on which a first connection pad 121P is disposed and a first inactive surface opposing the first active surface, a first encapsulant 130 disposed on the first surface of the first connection structure 140 and covering at least a portion of the first semiconductor chip 121, a second semiconductor chip 122 disposed on the second surface of the first connection structure 140, the second semiconductor chip 122 having a second active surface on which a second connection pad 122P is disposed and a second inactive surface opposing the second active surface, one or more first metal members 155 disposed on the second surface of the first connection structure 140 and electrically connected to the first signal pattern 142S, one or more second metal members 157 disposed on the second surface of the first connection structure 140 and electrically insulated from the first signal pattern 142S, a second encapsulant 150 disposed on the second surface of the first connection structure 140 and respectively covering at least portions of the second semiconductor chip 122 and the first and second metal members 155 and 157, and a second connection structure 160 disposed on an opposite side of a side of the second encapsulant 150, on which the first connection structure 140 is disposed, the second connection structure 160 including a second redistribution layer 162 having a second signal pattern 162S. In this case, the first and second connection pads 121P and 122P are electrically connected to each other through the first and second signal patterns 142S and 162S of the first and second redistribution layers 142 and 162, respectively, and the first metal member 155.

In recent years, techniques for stacking a plurality of memory chips in multiple stages for increasing memory capacity have been developed. For example, as illustrated in FIG. 17, a plurality of memory chips are stacked in two stages (or three stages) and the stacked memory chips are mounted on a printed circuit board, to be molded using a molding material, thereby being used in the form of a package. In this case, the stacked memory chips are electrically connected to the printed circuit board by wire bonding. However, since the thickness of the printed circuit board is considerable in such a structure, there is a limit to thinning. Further, there is a problem in that the cost is considerable when the printed circuit board is made of silicon base. In addition, if a reinforcing material for holding the stacked memory chips is not separately included, a problem in terms of reliability may be caused due to warpage. In detail, since the I/O is redistributed by being electrically connected to the printed circuit board through wire bonding, signal paths (a, b, c, and d) are relatively increase, resulting in a problem in which signal loss may occur frequently.

In addition, to stack semiconductor chips, such a wire bonding method requires that connection pads located in a central portion of an active surface of a chip are intentionally redistributed to an outer periphery of the active surface of the chip by forming a redistribution layer. For example, connection pads disposed in a row in the central portion of the active surface of a semiconductor chip in a bare state may be redistributed to an outer periphery of the active surface of the semiconductor chip, using a rewiring pattern of the redistribution layer. Alternatively, connection pads arranged in two rows in the central portion of the active surface of the semiconductor chip in the bare state may be redistributed to the outer periphery of the active surface of the semiconductor chip, using the rewiring pattern of the redistribution layer. In either case, the redistributed connection pads may be located on both sides of the active surface of the semiconductor chip. In this case, there is a limit in efficiently designing and disposing the semiconductor chip. For example, a signal loss may occur due to an increase in a signal path or the like. In addition, a separate redistribution process should be added, which may lead to reduction in productivity.

On the other hand, in the case of the fan-out semiconductor package 100A according to an example as illustrated in FIG. 16, signal paths ① and ② are formed through first and second connection vias 143 and 163 and the first metal member 155, other than wire bonding. Thus, the signal paths ① and ② may be significantly reduced, and signal loss may also be significantly reduced. Further, signal electric characteristics may be improved. In this case, by forming the plurality of first metal members 155 to connect the first and second redistribution layers 142 and 162 connected to different layers, a high current signal or the like may be transmitted, and thus, reliability can be improved.

In addition, in the fan-out semiconductor package 100A according to an example, not only the second semiconductor chip 122 disposed in a lower portion thereof but also the first semiconductor chip 121 disposed in an upper portion thereof may be packaged in a bare state. For example, the first and second connection pads 121P and 122P of the first and second semiconductor chips 121 and 122 may be disposed in central portions of active surfaces of the first and second semiconductor chips 121 and 122, respectively. In this case, the first and second connection pads 121P and 122P may be respectively arranged in one column or in two columns. The first connection pads 121p of the first semiconductor chip 121 may be connected to the first redistribution layer 142 of the first connection structure 140 through the first connection via 143, and connected to the second redistribution layer 162 further through the plurality of first metal members 155. As described above, it is unnecessary to form a redistribution layer in a chip state for redesigning the first and second connection pads 121P and 122P of the first and second semiconductor chips 121 and 122, and the first and second connection pads 121P and 122P located in the central portion of the first and second semiconductor chips 121 and 122 may also be used in the fan-out semiconductor package 100A as is without modification, to efficiently design the first and second semiconductor chips 121 and 122.

In addition, the fan-out semiconductor package 100A according to an example does not employ a printed circuit board, but may use the first connection structure 140 including the first redistribution layer 142 or the second redistribution layer 162 including the second connection structure 160, and the like. Accordingly, since the first and second redistribution layers 142 and 162 may be distributed in various positions, thicknesses of the first and second connection structures 140 and 160 may be significantly reduced. Further, a sealed backside thickness or a stacked chip thickness may be significantly reduced. The second inactive surface of the second semiconductor chip 122 may be bonded to the second surface of the first connection structure 140, using an adhesive member 125 or the like such as a die attach film (DAF), and the attached second semiconductor chip 122 may be sealed with the second encapsulant 150, such that the second semiconductor chip 122 may be effectively fixed and the reliability may be improved.

In detail, the fan-out semiconductor package 100A according to an example further includes a plurality of second metal members 157 disposed side by side with the first metal member 155 to be separated therefrom, and thus, warpage may be reduced. In detail, to reduce warpage, the effective coefficient of thermal expansion (CTE) of a lower region of the fan-out semiconductor package 100A should be controlled, because warpage due to curing shrinkage of the second encapsulant 150 may be problematic. To this end, in an example, a plurality of second metal members 157 electrically insulated from the first and second signal patterns 142S and 162S are employed. For example, when forming a plurality of first metal members 155 for connection of upper and lower signals are formed around the second semiconductor chip 122, the plurality of second metal members 157, which are a kind of dummy metal irrelevant to the signal connection, are formed together in free space, to control the coefficient of thermal expansion (CTE). The coefficient of thermal expansion (CTE) may be controlled by adjusting the number and diameter of the second metal members 157 and the like in detail. For example, by forming the number of the second metal members 157 to be greater than the number of the first metal members 155, the effect of reducing warpage may be significantly increased.

On the other hand, the first and second metal members 155 and 157 may have substantially the same thickness as each other. In this case, the fact that the thickness is substantially the same includes not only the case in which the thicknesses are completely equal but also the case in which a thickness difference slightly occurs due to a process error and the like even in the case in which they are formed together through the same process. In other words, even when formed by the same method, the thickness may not be completely the same, and there is always an error, which is a term used to reflect this point. As described above, the first and second metal members 155 and 157 may be formed through the same process, thereby simplifying the manufacturing process. In this case, upper and lower surfaces of the first and second metal members 155 and 157, for example, respective surfaces thereof contacting the first connection structure 140, and opposite surfaces thereof, may be coplanar with each other, respectively, to reduce undulation of the surface of the second encapsulant 150. As a result, the formation of the second connection structure 160, in which a microcircuit design is required, may be more facilitated. In this case, 'coplanar' is also understood as a concept reflecting not only a perfectly coinciding coplanar surface, but also a substantially formed coplanar surface, for example, a difference caused by an error due to some process.

The fan-out semiconductor package 100A according to an example may further include a third semiconductor chip 123 disposed on the first surface of the first connection structure 140 and having a third active surface on which a third connection pad 123P is disposed and a third inactive surface opposing the third active surface, and a fourth semiconductor chip 124 disposed on the second surface of the first connection structure 140 and having a fourth active surface on which a fourth connection pad 124P is disposed and a fourth inactive surface opposing the fourth active surface. The first and third semiconductor chips 121 and 123 may be disposed in parallel to each other, and the second and fourth semiconductor chips 122 and 124 may be disposed in parallel to each other. The first encapsulant 130 may cover at least a portion of the third semiconductor chip 123, and the second encapsulant 150 may cover at least a portion of the fourth semiconductor chip 124. The first to fourth connection pads 121P, 122P, 123P and 124P may be electrically connected to each other through the first and second signal patterns 142S and 162S of the first and second redistribution layers 142 and 162, respectively, and the first metal member 155. For example, the fan-out semiconductor package 100A according to the example may be designed in such a manner that a relatively larger number of the first to fourth semiconductor chips 121, 122, 123 and 124 may be provided in a single package 100A in a compact manner.

The fan-out semiconductor package 100A according to an example may further include a frame 110 having a through-hole 110H. In the through-hole 110H of the frame 110, the first and third semiconductor chips 121 and 123 may be disposed side by side in a face-down fashion with reference to the drawing. For example, when the frame 110 is introduced, warpage may also be controlled on the upper side of the fan-out semiconductor package 100A. First and second metal layers 112a and 112b may be disposed on two surfaces of the frame 110, and a third metal layer 115 may be disposed on an inner side of the through-hole 110H. An effect of reducing warpage may be further enhanced through the first to third metal layers 112a, 112b and 115, and further, a heat radiation effect and an electromagnetic wave shielding effect may be improved.

The fan-out semiconductor package 100A according to an example may further include a metal pattern layer 132 embedded in the first encapsulant 130 and having one surface exposed to the first encapsulant 130. By introducing the metal pattern layer 132, the effect of reducing warpage and the heat dissipation effect in the upper portion of the fan-out semiconductor package 100A may be significantly increased. Alternatively, the fan-out semiconductor package 100A may further include a passivation layer 170, an under-bump metal 180, an electrical connection metal 190, a cover layer 175, and the like as required.

Hereinafter, respective configurations included in the fan-out semiconductor package 100A according to an example will be described in more detail.

The frame 110 may maintain rigidity of the fan-out semiconductor package 100A depending on a detailed material, and may serve to secure thickness uniformity of the first encapsulant 130. The frame 110 has the through-hole 110H. In the through-hole 110H, the first and third semiconductor chips 121 and 123 may be spaced apart from the frame 110 by a predetermined distance. Side surfaces of the first and third semiconductor chips 121 and 123 may be surrounded by the frame 110, but the configuration thereof is not limited thereto, and may be variously modified, and may perform other functions depending on the type thereof. In some cases, the frame 110 may be omitted.

A material of an insulating layer 111 constituting the frame 110 is not particularly limited. For example, an insulating material may be used. As the insulating material, a thermosetting resin such as an epoxy resin, a thermoplastic resin such as polyimide, or an insulating material in which such resins are impregnated with a core material such as an inorganic filler and/or a glass fiber, a glass cloth, a glass fabric, or the like, for example, a prepreg resin, Ajinomoto Build-up Film (ABF) resin, FR-4 resin, Bismaleimide Triazine (BT) resin, or the like, may be used. The first to third metal layers 112a, 112b and 115 formed on the insulating layer 111 may include a metal material such as copper (Cu), aluminum (Al), silver (Ag), tin (Sn), gold (Au), nickel (Ni), lead (Pb), titanium (Ti), or alloys thereof. The first to third metal layers 112a, 112b and 115 may be connected to each other, and may be connected to a power or ground pattern (not illustrated) in the first redistribution layer 142, through a power or ground via (not illustrated) in the first connection via 143, as required.

The first to fourth semiconductor chips 121, 122, 123 and 124 may be integrated circuits (ICs) in which hundreds to millions of devices are integrated in a single chip. The integrated circuit may be, but is not limited to, a memory chip such as, for example, a volatile memory such as a dynamic random access memory (DRAM), a nonvolatile memory such as a read only memory (ROM), a flash memory or the like, and may be an application processor chip such as a central processor, for example, a central processing unit (CPU), a graphics processor, for example, a graphics processing unit (GPU), a digital signal processor, a cryptographic processor, a microprocessor, a microcontroller, or the like, a logic chip such as an analog-digital converter, an application-specific IC (ASIC), or the like, which may also be independently employed.

The surfaces of the first to fourth semiconductor chips 121, 122, 123 and 124, on which the first to fourth connection pads 121P, 122P, 123P and 124P are disposed respectively, are active surfaces, and surfaces thereof opposing the active surfaces are inactive surfaces. The first to fourth semiconductor chips 121, 122, 123 and 124 may be respectively formed on the basis of an active wafer. In this case, a base material of each body may be silicon (Si), germanium (Ge), gallium arsenic (GaAs) or the like. A variety of circuits may be formed in each body. The first to fourth connection pads 121P, 122P, 123P and 124P are provided to electrically connect the first to fourth semiconductor chips 121, 122, 123 and 124 to other components, and as a formation material thereof, a metal such as aluminum (Al), copper (Cu), or the like may be used without any particular limitation. The first to fourth semiconductor chips 121, 122, 123 and 124 may have a relatively greater number of connection pads, not illustrated in the drawings, a portion of which may be connected to ground, power, or the like, not for signal connection. If necessary, a passivation film (not illustrated) may be formed on each body to expose the first to fourth connection pads 121P, 122P, 123P and 124P. The passivation film (not illustrated) may be an oxide film, a nitride film or the like, or may be a double layer of an oxide film and a nitride film. Alternatively, an insulating film (not illustrated) or the like may be further disposed.

The first and third semiconductor chips 121 and 123 are disposed on the first surface of the first connection structure 140 in parallel to each other. In detail, in an example, the first and third semiconductor chips 121 and 123 are disposed side by side in the through-hole 110H of the frame 110. The first and third semiconductor chips 121 and 123 may be electrically connected to each other through the first redistribution layer 142 of the first connection structure 140. The first and third semiconductor chips 121 and 123 may be disposed in such a manner that the respective active surfaces thereof are in physical contact with the first surface of the first connection structure 140. The second and fourth semiconductor chips 122 and 124 are disposed on the second surface of the first connection structure 140 in parallel to each other. In detail, in an example, respective inactive surfaces thereof are attached to the second surface of the first connection structure 140 via an adhesive member 125 such as a die attach film (DAF). The second and fourth semiconductor chips 122 and 124 may be electrically connected to each other through the second redistribution layer 162 of the second connection structure 160.

The first to fourth connection pads 121P, 122P, 123P 124P of the first to fourth semiconductor chips 121, 122, 123 and 124 are used for signal connection as described above, and may be electrically connected to each other through the first and second signal patterns 142S and 162S of the first and second redistribution layers 142 and 162 and the first metal member 155. Other connection pads (not illustrated) of the first to fourth semiconductor chips 121, 122, 123 and 124 may be used for ground or power connection, respectively, as described above, and may be electrically connected to each other through a ground or power pattern (not illustrated) of the first and second redistribution layers 142 and 162, and a first metal member 155 used for some ground or power of the first metal member 155.

The first encapsulant 130 may protect the first and third semiconductor chips 121 and 123. The encapsulating shape is not particularly limited and may be a shape covering at least a portion of the frame 110 and the first and third semiconductor chips 121 and 123. For example, the first encapsulant 130 may cover at least a portion of an inactive surface of each of the frame 110 and the first and third semiconductor chips 121 and 123, and may fill at least a portion of the through-holes 110H. The first encapsulant 130 fills the through-hole 110H to serve as an adhesive for fixing the first and third semiconductor chips 121 and 123 depending on a detailed material and to reduce buckling. The first encapsulant 130 includes an insulating material. As the insulating material, a material including an inorganic filler and an insulating resin, for example, a thermosetting resin such as an epoxy resin, a thermoplastic resin such as polyimide, or a resin in which a reinforcing material such as an inorganic filler is included in these resins, in detail, ABF resin, FR-4 resin, BT resin, PIE, or the like may be used. A known molding material such as EMC may also be used. If necessary, a material in which a thermosetting resin or a thermoplastic resin is impregnated with a core material such as an inorganic filler and/or a glass fiber may be used.

The first connection structure 140 redistributes the first and third connection pads 121P and 123P of the first and third semiconductor chips 121 and 123. Other connection pads of the first and third semiconductor chips 121 and 123, not illustrated in the drawing, are also redistributed. Similarly, the second and fourth connection pads 122P and 124P of the second and fourth semiconductor chips 122 and 124 and other connection pads, not illustrated in the drawings, of the second and fourth semiconductor chips 122 and 124 may also be redistributed. Tens to hundreds of connection pads having various functions may be redistributed through the first connection structure 140, and may be physically and/or electrically connected to other components depending on functions thereof. The first connection structure 140 includes a first insulating layer 141, the first redistribution layer 142 disposed on the first insulating layer 141, and a first connection via 143 penetrating through the first insulating layer 141 to be connected to the first redistribution layer 142. On the other hand, the first insulating layer 141, the first redistribution layer 142, and the first connection via 143, which constitute the first connection structure 140, may have a relatively larger number of layers.

As the material of the first insulating layer 141, an insulating material may be used. In addition to the insulating material as described above, a photoimageable dielectric material, a Photo Imageable Dielectric (PID), may also be used. For example, the first insulating layer 141 may be a photoimageable insulating layer. In the case in which the first insulating layer 141 has a photosensitive property, the first insulating layer 141 may be formed to have a relatively thinner thickness, and a fine pitch of the first connection via 143 may be more easily obtained. The first insulating layer 141 may be a photoimageable dielectric layer including an insulating resin and an inorganic filler. For example, when the first insulating layer 141 is formed of multiple layers, the multiple layers may be formed of the same material or different materials as required. In the case in which the first insulating layer 141 is formed of multiple layers, the multiple layers may be integrally formed such that boundaries therebetween are not unclear, depending on a process, but an example thereof is not limited thereto.

The first redistribution layer 142 functions to redistribute the first to fourth connection pads 121P, 122P, 123P and 124P and a plurality of other connection pads not illustrated in the drawings to different regions. As a material thereof, a metal material such as copper (Cu), aluminum (Al), silver (Ag), tin (Sn), gold (Au), nickel (Ni), lead (Pb), titanium (Ti) or alloys thereof may be used. The first redistribution layer 142 may perform various functions according to the design of a relevant layer. For example, the first redistribution layer 142 may include a ground pattern (not illustrated), a power pattern (not illustrated), a signal pattern 142S, and the like. The signal pattern 142S may include various signals except a ground pattern, a power pattern, and the like, for example, may include a data signal and the like, and further, may also include connection via pads for various applications.

The first connection via 143 electrically connects the first redistribution layer 142 to a plurality of connection pads including the first and third connection pads 121P and 123P formed in different layers, thereby forming an electrical path. The first connection via 143 electrically connects the first redistribution layer 142 to the first metal member 155. A ground or power via (not illustrated) other than a signal via 143S in the first connection via 143 may be used for upper and lower electrical use, for example, may electrically connect the ground pattern or power pattern (not illustrated) in the first redistribution layer 142 to the first metal layer 112b. As a material of the first connection via 143, a metal such as copper (Cu), aluminum (Al), silver (Ag), tin (Sn), gold (Au), nickel (Ni), lead (Pb), titanium (Ti) or alloys thereof may be used. The first connection via 143 may be a filled-type via completely filled with a metal material, or may be a conformal-type via formed as a metal material is formed along a wall surface of the via hole. Further, the first connection via 143 may have a taper shape or the like.

The second encapsulant 150 may protect the second and fourth semiconductor chips 122 and 124. The sealing form is not particularly limited, and any form of surrounding at least portions of the first and second metal members 155 and 157 and the second and fourth semiconductor chips 122 and 124 may be used. For example, the second encapsulant 150 may cover at least a portion of each of the first and second metal members 155 and 157 and the active surface of the second and fourth semiconductor chips 122 and 124. The second encapsulant 150 may provide an insulating region for formation of a first second redistribution layer 162 and the second connection via 163 of the second connection structure 160. The second encapsulant 150 includes an insulating material. As the insulating material, a material including an inorganic filler and an insulating resin, for example, a thermosetting resin such as an epoxy resin, a thermoplastic resin such as polyimide, or a resin containing a reinforcing material such as an inorganic filler in these resins, in detail, ABF, FR-4 resin, BT resin, PIE, or the like may be used. In addition, a known molding material such as EMC may also be used. If necessary, a material in which a thermosetting resin or a thermoplastic resin is impregnated with a core material such as an inorganic filler and/or a glass fiber or the like may be used. In an example, but without any limit, the first and second encapsulants 130 and 150 may include different materials. For example, the first encapsulant 130 may be a non-photoimageable dielectric material such as ABF to reduce warpage, and the second encapsulant 150 may include a photoimageable dielectric material such as PIE for formation of a microcircuit, but an example thereof is not limited thereto.

The first metal member 155 is basically provided for upper and lower signal connections of the fan-out semiconductor package 100A, but is not limited to the signal connection. Although not illustrated in detail in the drawing, a portion of the first metal member 155 may also be used for upper and lower connection of power or ground connection. The first metal member 155 may be more or less than those illustrated in the drawings, depending on the design. The first metal member 155 may be comprised of a first metal portion 155a and a second metal portion 155b. The second metal portion 155b may be formed together by a plating process, when the signal via 143S connected to the first metal member 155 in the first connection via 143 is formed. The first metal portion 155a may function as a pad when forming the second metal portion 155b, and thus, a width (or a diameter) of the first metal portion 155a may be the same as, or greater than a width (or a diameter) of the second metal portion 155b unlike the drawing. A height of the second metal portion 155b may be greater than a height of the first metal portion 155a. The first metal portion 155a may be composed of a seed layer including titanium (Ti) and/or copper (Cu) formed by sputtering, and a plating layer including copper (Cu) formed on the seed layer by electrolytic plating. For example, the first metal portion 155a may be composed of a multilayer metal layer. The second metal portion 155b may be formed of a plating layer containing copper (Cu) formed by electrolytic plating. As a result, the first metal member 155 may be a metal post composed of a multilayer metal layer. The first metal member 155 may be electrically connected to the signal pattern 142S in the first redistribution layer 142 through the signal via 143S in the first connection via 143. The first metal member 155 may be electrically connected to the signal pattern 162S in the second redistribution layer 162 through a signal via 163S in the second connection via 163. The first metal member 155 may be electrically connected to a ground or power pattern (not illustrated) of the first redistribution layer 142 through a ground or power via (not illustrated) of the first connection via 143. In addition, the first metal member 155 may be electrically connected to a ground or power pattern (not illustrated) of the second redistribution layer 162 through a ground or power via (not illustrated) of the second connection via 163.

The second metal member 157 is provided for warpage control of the fan-out semiconductor package 100A. The second metal member 157 may be more or less than that those illustrated in the drawings depending on the design. Unlike the first metal member 155, the second metal member 157 may only be composed of one metal portion 157. In this case, the metal portion 157 may be composed of a seed layer containing titanium (Ti) and/or copper (Cu) formed by sputtering, and a plating layer containing copper (Cu) formed on the seed layer by electrolytic plating. For example, the second metal member 157 may be composed of a multilayer metal layer. As a result, the second metal member 157 may also be a metal post composed of a multilayer metal layer. On the other hand, the number of metal layers included in the first metal member 155 may be greater than the number of metal layers included in the second metal member 157. The second metal member 157 may be formed on a lower surface of the first insulating layer 141 of the first connection structure 140 and may be electrically completely isolated from other constituent elements, for example, electrically respectively isolated.

The second connection structure 160 redistributes the second and fourth connection pads 122P and 124P of the second and fourth semiconductor chips 122 and 124. Other connection pads (not illustrated) of the second and fourth semiconductor chips 122 and 124 are also redistributed. Similarly, the first and third connection pads 121P and 123P of the first and third semiconductor chips 121 and 123 and other connection pads (not illustrated) of the first and third semiconductor chips 121 and 123 may also be redistributed. Tens to hundreds of connection pads having various functions may be redistributed through the second connection structure 160, and may be physically and/or electrically connected to other constituent elements, depending on functions thereof. The second connection structure 160 includes a second insulating layer 161, the second redistribution layer 162 disposed on the second insulating layer 161, and the second connection via 163 penetrating through the second insulating layer 161 to be connected to the second redistribution layer 162. On the other hand, the second insulating layer 161, the second redistribution layer 162 and the second connection via 163, constituting the second connection structure 160, may have a relatively greater or less number of layers.

As the material of the second insulating layer 161, an insulating material may be used. In this case, as the insulating material, a photoimageable dielectric material such as PID as described above may be used. For example, the second insulating layer 161 may also be a photoimageable dielectric layer. For example, when the second insulating layer 161 has photoimageable properties, the second insulating layer 161 may be formed to be relatively thinner, and in this case, a fine pitch of the second connection via 163 may be easily obtained. The second insulating layer 161 may be a photoimageable dielectric layer including an insulating resin and an inorganic filler. For example, when the second insulating layer 161 has multiple layers, the multiple layers may be formed of the same material, and may be formed of different materials as needed. In the case in which the second insulating layer 161 is multilayered, the multiple layers may be integrally formed depending on a process such that boundaries therebetween are unclear, but an example thereof is not limited thereto.

The second redistribution layer 162 functions to redistribute the first to fourth connection pads 121P, 122P, 123P and 124P and a plurality of other connection pads not illustrated in the drawings to different regions. As a material thereof, a metal material such as copper (Cu), aluminum (Al), silver (Ag), tin (Sn), gold (Au), nickel (Ni), lead (Pb), titanium (Ti) or alloys thereof may be used. The second redistribution layer 162 may perform various functions according to the design of a relevant layer. For example, the second redistribution layer 162 may include a ground pattern (not illustrated), a power pattern (not illustrated), a signal pattern 162S, and the like. The signal pattern 162S may include various signals except for a ground pattern, a power pattern, and the like, for example, may include a data signal and the like, and further, may also include connection via pads for various applications.

The second connection via 163 electrically connects the second redistribution layer 162 to a plurality of connection pads including the second and fourth connection pads 122P and 124P formed in different layers, thereby forming an electrical path. The second connection via 163 electrically connects the second redistribution layer 162 to the first metal member 155. A ground or power via (not illustrated) other than the signal via 163S in the second connection via 163 may be used for upper and lower electrical use of a ground pattern or power pattern (not illustrated) in the second redistribution layer 162. As a material of the second connection via 163, a metal such as copper (Cu), aluminum (Al), silver (Ag), tin (Sn), gold (Au), nickel (Ni), lead (Pb), titanium (Ti) or alloys thereof may be used. The second connection via 163 may be a filled-type via completely filled with a metal material, or may be a conformal-type via formed as a metal material is formed along a wall surface of a via hole. Further, the second connection via 163 may have a taper shape or the like.

The passivation layer 170 may protect the second redistribution layer 162 and the like from external physical chemical damage and the like. The passivation layer 170 may have a plurality of openings respectively exposing at least a portion of the second redistribution layer 162. As the openings, tens to tens of thousands of openings may be formed in the passivation layer 170. A material of the passivation layer 170 is not particularly limited, and for example, a photoimageable dielectric material such as a PID resin may be used. Alternatively, a known solder resist may be used. Alternatively, ABF including an inorganic filler and an epoxy resin may be used.

The under bump metal 180 improves connection reliability of the electrical connection metal 190, and may improve board level reliability of the fan-out semiconductor package 100A. The under bump metal 180 is connected to the second redistribution layer 162 exposed through the opening of the passivation layer 170. The under bump metal 180 may be formed by using a metallic material known in the art, for example, a metal, in the opening of the passivation layer 170, through a known metallization method, but an example thereof is not limited thereto. The under bump metal 180 may be provided for signal connection or for ground or power connection depending on functions thereof. The number of under bump metals 180 is not particularly limited, and tens to tens of thousands of under bump metals may be formed.

The electrical connection metal 190 is an additional configuration to physically and/or electrically connect the fan-out semiconductor package 100A externally. For example, the fan-out semiconductor package 100A may be mounted on a main board of an electronic device through the electrical connection metal 190. The electrical connection metal 190 may be formed of a low melting point metal including tin (Sn), for example, solder or the like, which is merely an example. The material thereof is not particularly limited. The electrical connection metal 190 may be a land, a ball, a pin, or the like. The electrical connection metal 190 may be formed of a multilayer or a single layer. In the case in which the electrical connection metal 190 is formed of multiple layers, a copper pillar and solder may be included therein. In the case of a single layer, a tin-silver solder or copper may be included in the electrical connection metal 190, but a material thereof is not limited thereto.

The number, spacing, arrangement type, and the like of the electrical connection metal 190 are not particularly limited, and may be sufficiently modified according to the design specifications by those skilled in the art. For example, the number of the electrical connection metals 190 may be in the range of tens to tens of thousands, and may be more or less numbers. For example, when the electrical connection metal 190 is a solder ball, the electrical connection metal 190 may cover a side surface of the under bump metal 180 extending on one surface of the passivation layer 170, and in this case, connection reliability may be relatively further excellent.

At least one of the electrical connection metals 190 is disposed in a fan-out area. The fan-out area refers to an area outside an area in which the first to fourth semiconductor chips 121, 122, 123 and 124 are disposed. For example, the fan-out semiconductor package 100A according to an example is a fan-out package. In the case of the fan-out package, reliability is excellent, a large number of I/O terminals may be implemented, and 3D interconnection may be facilitated, as compared with those of a fan-in package. In addition, compared with a ball grid array (BGA) package, a land grid array (LGA) package or the like, a package thickness may be reduced and excellent price competitiveness may be provided in the case of the fan-out package.

The cover layer 175 may protect the metal pattern layer 132 and the like from external physical chemical damage and the like. As a material of the cover layer 175, a photoimageable dielectric material such as a PID resin may be used. Alternatively, known solder resist may be used. Alternatively, ABF including an inorganic filler and an epoxy resin may be used.

The metal pattern layer 132 may further significantly increase an effect of reducing warpage and a heat radiation effect on an upper side of the fan-out semiconductor package 100A. The metal pattern layer 132 is embedded in the first encapsulant 130, and one surface of the metal pattern layer 132 may be exposed to the first encapsulant 130. The metal pattern layer 132 may include a metal such as copper (Cu), aluminum (Al), silver (Ag), tin (Sn), gold (Au), nickel (Ni), lead (Pb), titanium (Ti), alloys thereof, or the like.

Although not illustrated in the drawings, a separate passive component such as a capacitor or an inductor may be further disposed in the through-hole 110H as required. Further, a surface mount component may be further disposed on a surface of the passivation layer 170. In addition, structures known in the art may also be applied.

Figure 12:
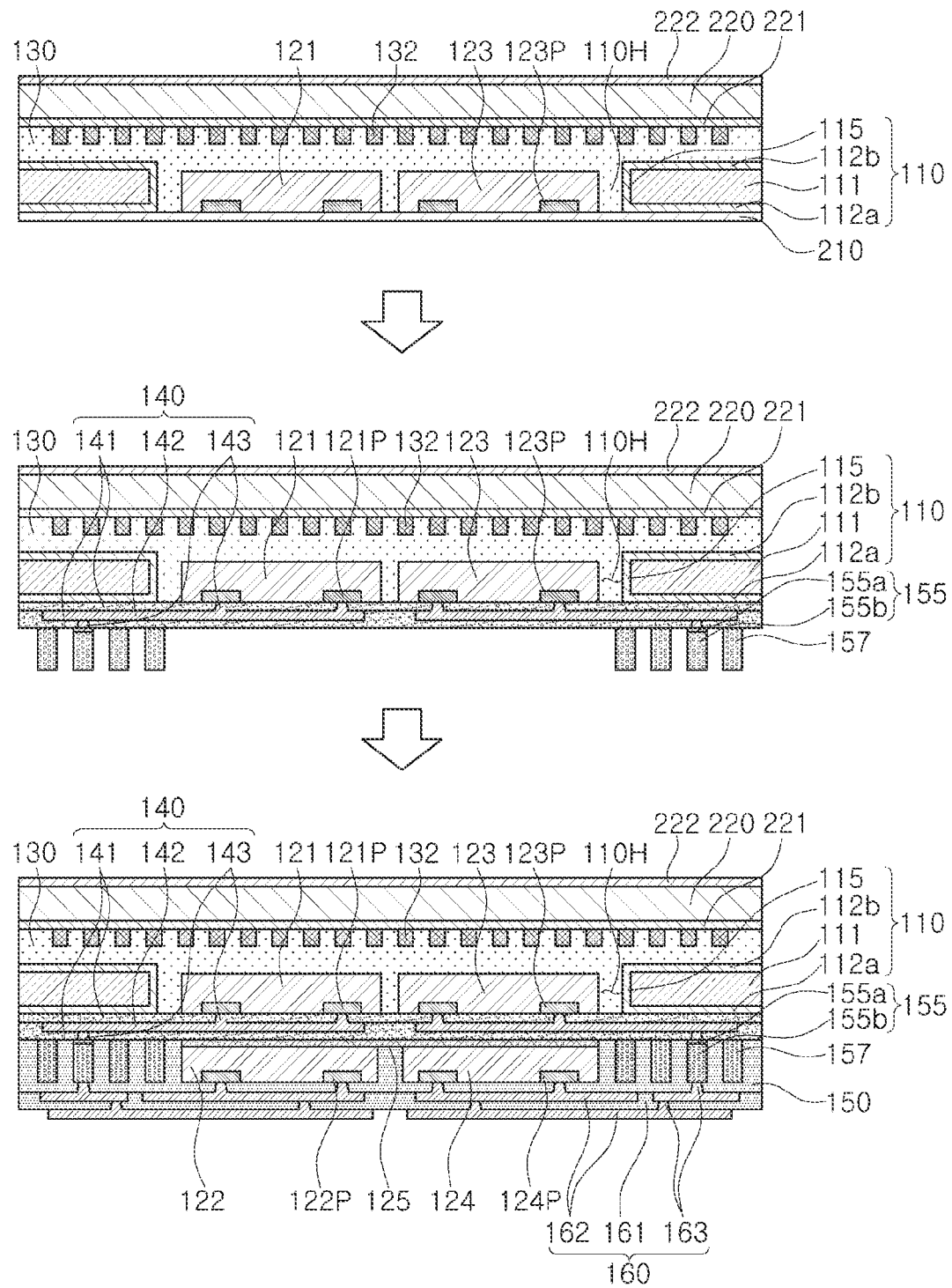
FIGS. 12 and 13 are views illustrating a schematic manufacturing example of the fan-out semiconductor package of FIG. 9.
Figure 13:
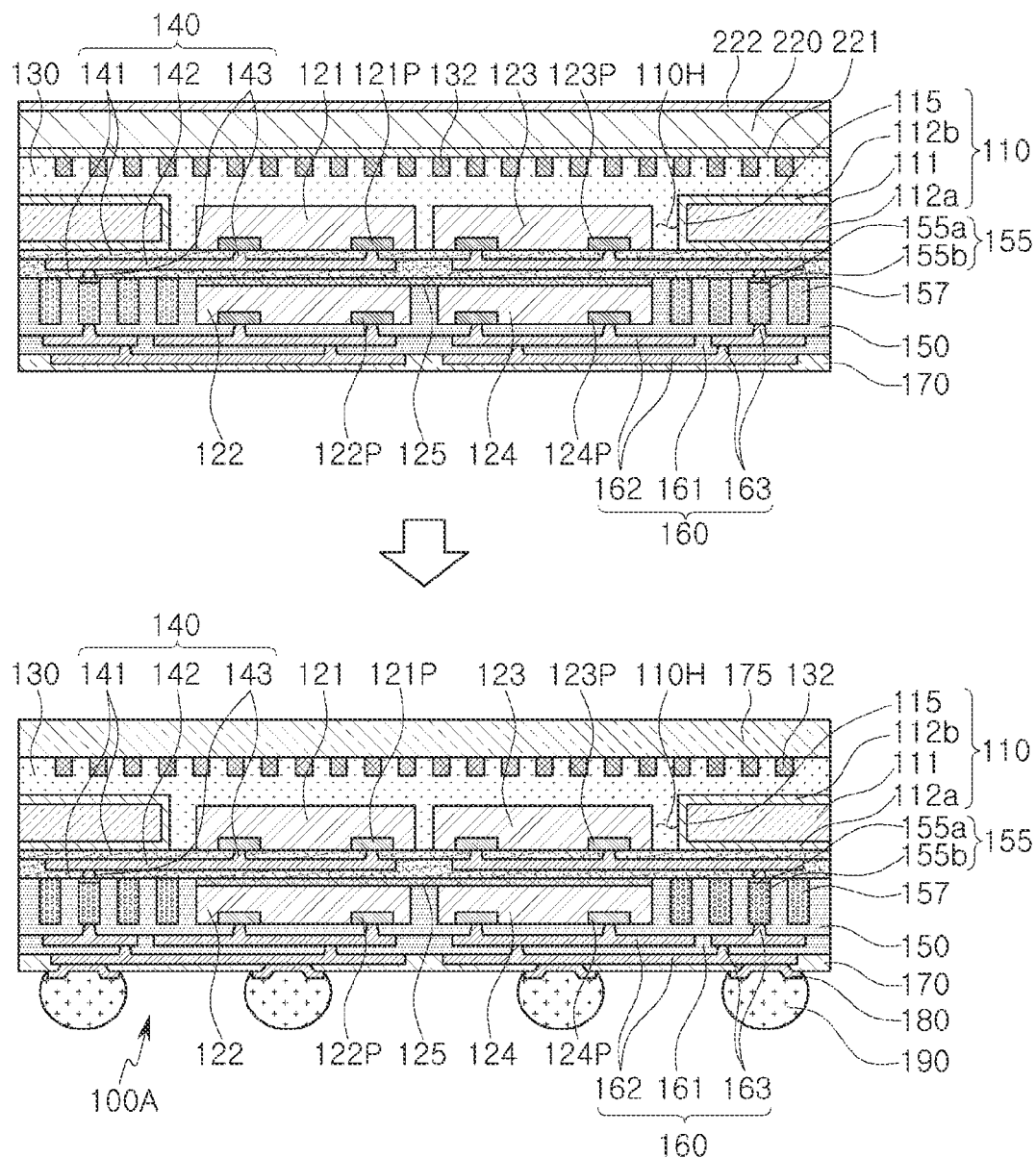

FIGS. 12 and 13 are views illustrating a schematic manufacturing example of the fan-out semiconductor package of FIG. 9.

Referring to FIG. 12, an upper structure of the package is formed using a tape 210. In detail, a through-hole 110H is formed in an insulating layer 111, using a copper clad laminate (CCL) or the like, and a frame 110 in which first to third metal layers 112a, 112b and 115 are formed by plating is prepared. First and third semiconductor chips 121 and 123 are disposed in the through-hole 110H in a face-down manner, in such a manner that first and third connection pads 121P and 123P face the tape 210, to be sealed with a first encapsulant 130. Thereafter, a metal pattern layer 132 is formed on one surface of a carrier 220 on which metal layers 221 and 222 are formed on both surfaces thereof, and the carrier 220 is laminated on the first encapsulant 130 in such a manner that the metal pattern layer 132 is embedded in the first encapsulant 130. Next, the tape 210 is removed, a first connection structure 140 is formed by forming a first insulating layer 141, a first redistribution layer 142, and a first connection via 143, and first and second metal members 155 and 157 are formed on a lower surface of the first connection structure 140. The first insulating layer 141 may be formed by PID coating, curing and the like, and the first redistribution layer 142 and the first connection via 143 may be formed by a known plating process. The first and second metal members 155 and 157 may be formed by a plating process using a resist film. Next, second and fourth semiconductor chips 122 and 124 are attached to a lower surface of the first connection structure 140 via the adhesive member 125 in a face-down manner such, in such a manner that second and fourth connection pads 122P and 124P are directed downward, to then be sealed by a second encapsulant 150. Then, portions of a second redistribution layer 162 and a second connection via 163 are formed by a known plating process. In this case, in a case in which the second encapsulant 150 includes PIE, a via hole for the second connection via 163 may be formed by a photolithography process.

Referring to FIG. 13, subsequently, a second insulating layer 161, a second redistribution layer 162, and a second connection via 163 are further formed to form a second connection structure 160. The second insulating layer 161 may also be formed by PID coating, curing and the like. Thereafter, a passivation layer 160 is laminated on a lower portion of the second connection structure 160. Next, the carrier 220 is removed, the remaining metal layer 221 is removed by etching, and a cover layer 175 is formed on the package from which the carrier 220 is removed. In addition, by forming an under bump metal 180 and an electrical connection metal 190 on the passivation layer 160, the fan-out semiconductor package 100A according to the above-described example may be manufactured.

On the other hand, a series of operations may be operations of preparing a large-sized frame 110 to facilitate mass production, manufacturing a plurality of fan-out semiconductor packages, and then, performing singularization into individual fan-out semiconductor packages through a sawing process. In this case, there is an advantage in that productivity is excellent.

Figure 14:
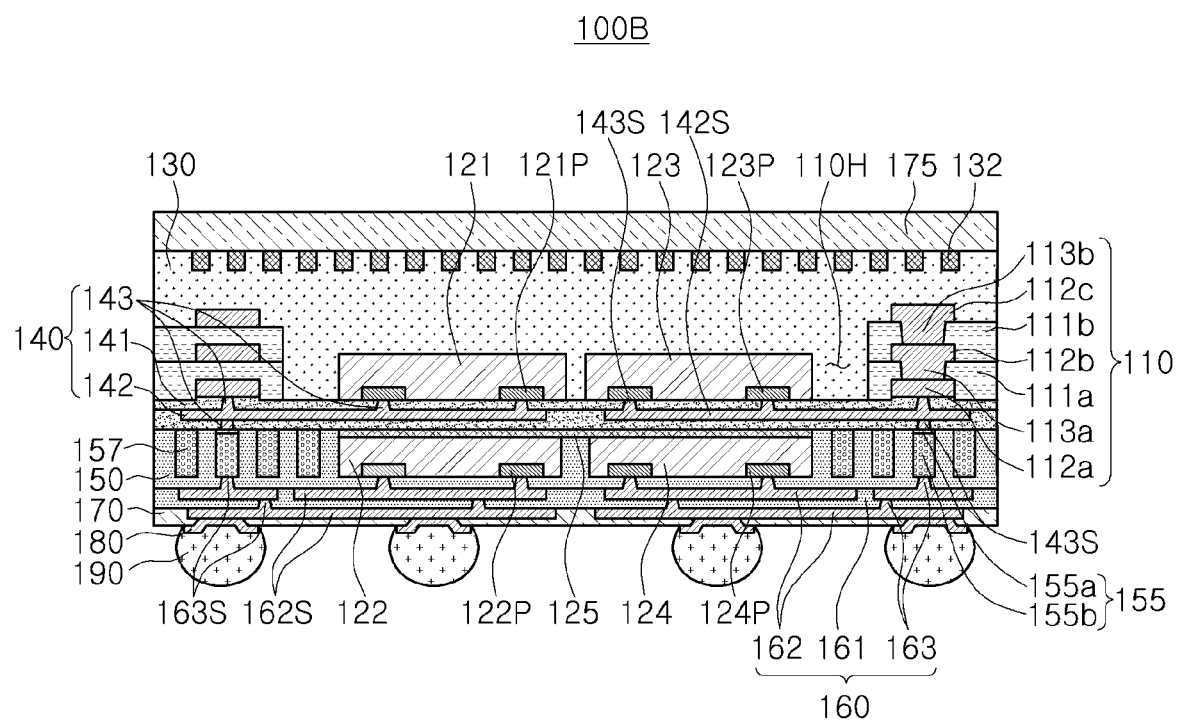
FIG. 14 is a schematic cross-sectional view of another example of a fan-out semiconductor package.

FIG. 14 is a cross-sectional view schematically illustrating another example of the fan-out semiconductor package.

Referring to FIG. 14, in the case of a fan-out semiconductor package 100B according to another example, the frame 110 may include a first insulating layer 111a in contact with the first connection structure 140, a first wiring layer 112a in contact with the first connection structure 140 and embedded in the first insulating layer 111a, a second wiring layer 112b disposed on a side of the first insulating layer 111a, opposing a side of the first insulating layer 111a, in which the first wiring layer 112a is embedded, a second insulating layer 111b disposed on the side of the first insulating layer 111a, opposing the side of the first insulating layer 111a, in which the first wiring layer 112a is embedded, the second insulating layer 111b covering the second wiring layer 112b, and a third wiring layer 112c disposed on a side of the second insulating layer 111b, opposing a side of the second insulating layer 111b, in which the second wiring layer 112b is embedded. The first to third wiring layers 112a, 112b and 112c may be electrically connected to each other through a first wiring via 113a and a second wiring via 113b, penetrating through the first and second insulating layers 111a and 111b, respectively. The first to third wiring layers 112a, 112b and 112c may be electrically connected to the first and second redistribution layers 142 and 162 and a plurality of connection pads, including first to fourth connection pads 121P, 122P, 123P and 124P.

The frame 110 includes a large number of wiring layers 112a, 112b and 112c, and may be simplified by performing a portion of the function of the first connection structure 140. Therefore, a reduction in yield due to defects occurring in the process of forming the first connection structure 140 may be decreased. Since the first wiring layer 112a is embedded, an insulation distance of the first insulating layer 141a of the first connection structure 140 may be relatively constant. The first wiring layer 112a may be recessed into the first insulating layer 111a, and thus, a lower surface of the first insulating layer 111a and a lower surface of the first wiring layer 112a may be stepped, thereby preventing the first encapsulant 130 from bleeding into the first wiring layer 112a. A thickness of each of the wiring layers 112a, 112b and 112c of the frame 110 may be greater than a thickness of each of the first and second redistribution layers 142 and 162 of the first and second connection structures 140 and 160. The frame 110 may have a thickness greater than that of the first and third semiconductor chips 121 and 123, and thus, the wiring layers 112a, 112b and 112c may also be formed to have a relatively larger size in accordance with the scale. On the other hand, the first and second redistribution layers 142 and 162 of the first and second connection structures 140 and 160 may be formed to have a relatively small size for thinning and microcircuit designing.

In the case of the frame 110, for example, a carrier film on which a metal film is formed on one surface or both surfaces thereof is prepared, the first wiring layer 112a is formed by using the metal film as a seed layer, the first insulating layer 111a is formed on the metal film to cover the first wiring layer 112a, the second wiring layer 112b is formed on the first insulating layer 111a, the second insulating layer 111b is formed on the first insulating layer 111a to cover the second wiring layer 112b, and the third wiring layer 112c is formed on the second insulating layer 111b, thereby forming the frame 110. After separating the frame 110 from the carrier film, the metal film remaining on the first wiring layer 112a is removed. A recess may be formed in the frame 110 when the metal film is removed. The wiring layers 112a, 112b and 112c may be formed by patterning using a dry film or the like and then filling the pattern by a known plating process. The insulating layers 111a and 111b may be formed by a known lamination method or a coating and curing method. On the other hand, when via holes are formed in the first and second insulating layers 111a and 111b to form the second and third wiring layers 112b and 112c, the first and second wiring vias 113a and 113b may also be formed by plating, and thus, may be integrated with the second and third wiring layers 112b and 112c, respectively.

Other configurations and manufacturing methods are substantially the same as those described in the fan-out semiconductor package 100A according to the above-described example, and thus, descriptions thereof are omitted.

Figure 15:
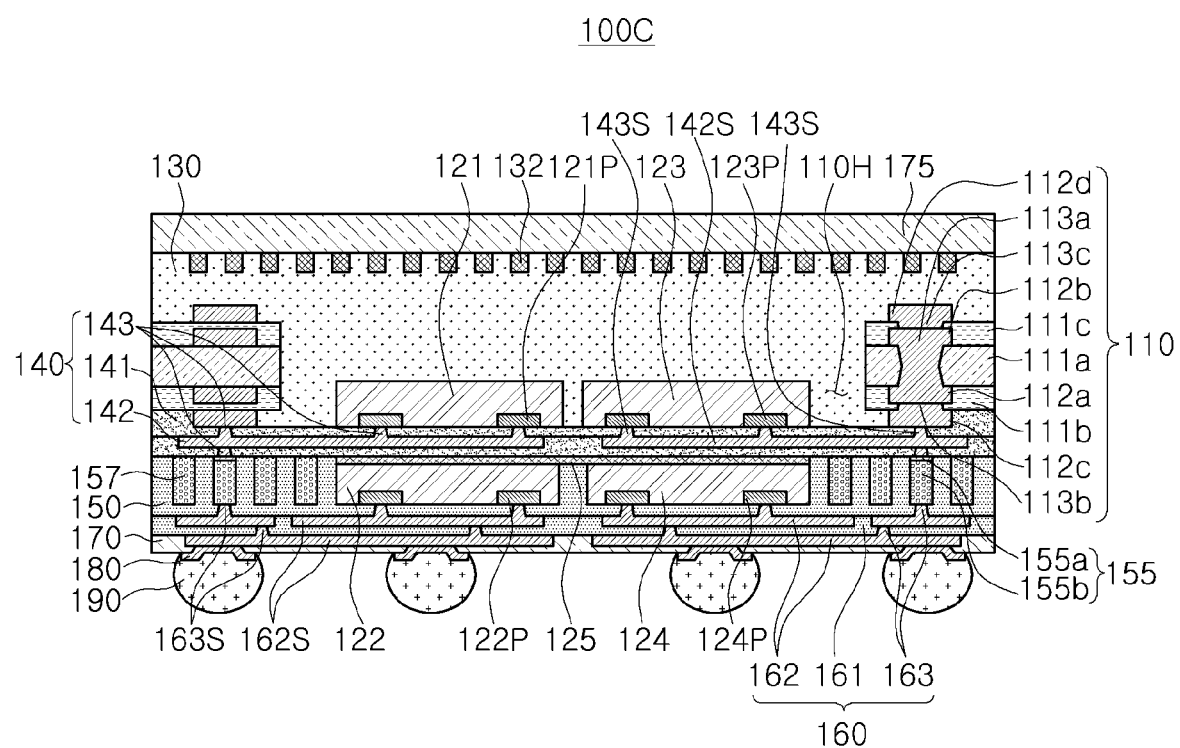
FIG. 15 is a schematic cross-sectional view of another example of a fan-out semiconductor package.

FIG. 15 is a cross-sectional view schematically illustrating another example of the fan-out semiconductor package.

Referring to FIG. 15, in the case of a fan-out semiconductor package 100C according to another example, the frame 110 includes a first insulating layer 111a, a first wiring layer 112a and a second wiring layer 112b disposed on both surfaces of the first insulating layer 111a, a second insulating layer 111b disposed on one surface of the first insulating layer 112a and covering the first wiring layer 112a, a third wiring layer 112c disposed on an opposite side of a side of the second insulating layer 111b in which the first wiring layer 112a is embedded, a third insulating layer 111c disposed on the other surface of the first insulating layer 111a and covering the second wiring layer 112b, and a fourth wiring layer 112d disposed on an opposite side of a side of the third insulating layer 111c in which the second wiring layer 112b is embedded. The first to fourth wiring layers 112a, 112b, 112c and 112d are electrically connected to each other through first through third wiring vias 113a, 113b and 113c passing through the first through third insulating layers 111a, 111b and 111c, respectively. The first to fourth wiring layers 112a, 112b, 112c and 112d are electrically connected to the first and second redistribution layers 142 and 162 and a plurality of connection pads including first to fourth connection pads 121P, 122P, 123P and 124P.

Since the frame 110 includes a large number of wiring layers 112a, 112b, 112c and 112d, the first connection structure 140 may be further simplified. The first insulating layer 111a may have a thickness greater than that of each of the second and third insulating layers 111b and 111c. The first insulating layer 111a may be relatively thick to maintain rigidity, and the second insulating layer 111b and the third insulating layer 111c are employed to have a relatively larger number of wiring layers 112c and 112d, and thus, may have a relatively reduced thickness. An average diameter of the first wiring vias 113a may be greater than an average diameter of each of the second and third wiring vias 113b and 113c. The thicknesses of the wiring layers 112a, 112b, 112c and 112d of the frame 110 may be greater than the thicknesses of the first and second redistribution layers 142 and 162 of the first and second connection structures 140 and 160, similarly as described above.

The frame 110 is prepared by preparing a copper clad laminate (CCL) using the first insulating layer 111a, forming the first and second wiring layers 112a and 112b on both surfaces of the first insulating layer 111a by using a copper film of the copper clad laminate (CCL) as a seed layer, laminating ABF or the like as the second and third insulating layers 111b and 111c on both surfaces of the first insulating layer 111a, respectively, and forming the third and fourth wiring layers 112c and 112d on the second and third insulating layers 111b and 111c, respectively. The wiring layers 112a, 112b, 112c and 112d may be formed by patterning using a dry film or the like and then filling the pattern by a known plating process. The insulating layers 111b and 111c may be formed by a known lamination method or a coating and curing method. On the other hand, when via holes are formed in the first to third insulating layers 111a, 111b and 111c to form the first to fourth wiring layers 112a, 112b, 112c and 112d, the first and third wiring vias 113a, 113b and 113c may also be formed by plating. Thus, the first wiring via 113a may be integrated with the first and second wiring layers 112a and 112b, the second wiring via 113b may be integrated with the third wiring layer 112c, and the third wiring via 113c may be integrated with the fourth wiring layer 112d.

Other configurations and manufacturing methods are substantially the same as those described in the fan-out semiconductor package 100A according to the above-described example, and thus, descriptions thereof are omitted.

As set forth above, according to an example, a fan-out semiconductor package in which thinning and high performance may be implemented and warpage may also be reduced even when a plurality of semiconductor chips are used may be provided.

The expression, an example, used in this disclosure does not mean the same embodiment, but is provided for emphasizing and explaining different unique features. However, the above-mentioned examples do not exclude being implemented in combination with the features of other examples. For example, although the description in the specific example is not described in another example, it may be understood as an explanation related to another example, unless otherwise described or contradicted by the other example.

The meaning of being connected in the present disclosure encompasses not only a direct connection, but also includes an indirect connection. In addition, the term "electrically connected" means a concept including both a physical connection and non-connection. Further, the first and second expressions are used to distinguish one component from another component and do not limit the order and/or importance of components and the like. In some cases, without departing from the scope of the rights, a first component may be referred to as a second component, and similarly, a second component may also be referred to as a first component.

In the present disclosure, an upper portion, a lower portion, an upper side, a lower side, an upper surface, a lower surface, and the like are determined based on the attached drawings. For example, the connection member is located above the redistribution layer. However, the claims are not limited thereto. In addition, the vertical direction means the above-mentioned upper and lower directions, and the horizontal direction means the direction perpendicular thereto. In this case, the vertical cross-section means a case of cutting into a plane in the vertical direction, and the cross-sectional view shown in the drawings is an example. In addition, the horizontal cross-section means a case of cutting into a plane in the horizontal direction, for example, the plan view shown in the drawing.

The terms used in this disclosure are only used to illustrate an example and are not intended to limit the present disclosure. The singular expressions include plural expressions unless the context clearly dictates otherwise.

What is claimed is:

1. A fan-out semiconductor package comprising:
a connection structure including a redistribution layer containing a signal pattern;
a first semiconductor chip disposed on the connection structure, the first semiconductor chip having a first active surface on which a first connection pad is disposed and a first inactive surface opposing the first active surface;
first metal members disposed on the connection structure and electrically connected to the signal pattern;
second metal members disposed on the connection structure and electrically insulated from the signal pattern and the first semiconductor chip; and
an encapsulant disposed on the connection structure and respectively covering at least portions of the first semiconductor chip and the first and second metal members,
wherein the first connection pad is electrically connected to the first metal members through the signal pattern of the redistribution layer, and wherein an entire lower surface of each of the second metal members is covered by the encapsulant.

2. The fan-out semiconductor package of claim 1, wherein the first and second metal members have a substantially same thickness.

3. The fan-out semiconductor package of claim 1, wherein the connection structure includes a insulating layer, the redistribution layer on the insulating layer, and a plurality of connection via penetrating through the encapsulant to be connected to the redistribution layer, and
wherein the first metal members are connected to the plurality of connection via.

4. The fan-out semiconductor package of claim 3, wherein the second metal members are electrically isolated from each other and from the redistribution layer.

5. The fan-out semiconductor package of claim 3, wherein the first active surface is disposed on the connection structure, and
the first connection pad is connected with the plurality of connection via.

6. The fan-out semiconductor package of claim 1, wherein the first and second metal members are metal posts.

7. The fan-out semiconductor package of claim 6, wherein each of the first metal members include a first metal portion and a second metal portion, and
each of second metal members include one metal portion.

8. The fan-out semiconductor package of claim 6, wherein each of the first and second metal members includes a multilayer metal layer.

9. The fan-out semiconductor package of claim 8, wherein a number of metal layer included in each of the first metal members is greater than a number of metal layers included in each of the second metal members.

10. The fan-out semiconductor package of claim 1, wherein the first and second metal members are disposed to be parallel to the first semiconductor chip.

11. The fan-out semiconductor package of claim 1, wherein a number of the second metal members is greater than a number of the first metal members.

12. The fan-out semiconductor package of claim 1, further comprising:
a second semiconductor chip disposed on the connection structure, the second semiconductor chip having a second active surface on which a second connection pad is disposed and a second inactive surface opposing the second active surface,
wherein the first semiconductor chip and the second semiconductor chip are disposed to be parallel to each other,
the encapsulant covers at least a portion of the second semiconductor chip, and
the first and second connection pads are electrically connected to each other through the signal pattern of the redistribution layer.

13. A fan-out semiconductor package comprising:
a lower connection structure including a lower redistribution layer containing a lower signal pattern, the lower connection structure having a first surface and a second surface opposing each other;
a first semiconductor chip disposed on the first surface of the lower connection structure, the first semiconductor chip having a first active surface on which a first connection pad is disposed and a first inactive surface opposing the first active surface;
a plurality of first metal members disposed on the first surface of the lower connection structure and electrically connected to the lower signal pattern;
a plurality of second metal members disposed on the first surface of the lower connection structure and electrically insulated from the lower signal pattern and the first semiconductor chip;
an encapsulant disposed on the first surface of the lower connection structure and respectively covering at least portions of the first semiconductor chip, the plurality of first metal members and the plurality of second metal members; and
an upper connection structure disposed on the encapsulant, the plurality of first metal members and the plurality of second metal members, and including an upper redistribution layer containing an upper signal pattern,
wherein the plurality of second metal members are insulated from the upper connection structure and from the lower connection structure.

14. The fan-out semiconductor package of claim 13, wherein the upper connection structure and the lower connection structure are electrically connected through the plurality of first metal members.

15. The fan-out semiconductor package of claim 13, wherein each of the plurality of second metal members is disposed to be parallel to each of the plurality of first metal members.

16. The fan-out semiconductor package of claim 13, wherein upper surfaces of the plurality of first metal members are disposed at a substantially same level with upper surfaces of the plurality of second metal members.

17. The fan-out semiconductor package of claim 13, wherein each of the plurality of first metal members and each of the plurality of second metal members have substantially a same thickness.

18. The fan-out semiconductor package of claim 13, wherein a number of the plurality of second metal members is greater than a number of the plurality of first metal members.

19. The fan-out semiconductor package of claim 13, further comprising:
a second semiconductor chip disposed on the first surface of the lower connection structure, the second semiconductor chip having a second active surface on which a second connection pad is disposed and a second inactive surface opposing the second active surface,
wherein the first semiconductor chip and the second semiconductor chip are disposed to be parallel to each other,
the encapsulant covers at least a portion of the second semiconductor chip, and
the first and second connection pads are electrically connected to each other through the lower and upper signal patterns of the lower and upper redistribution layers, respectively, and the plurality of first metal members.

20. The fan-out semiconductor package of claim 13, further comprising a passivation layer on the second surface of the lower connection structure, and an under bump metal connected to the lower redistribution layer exposed through a opening of the passivation layer.

* * * * *